(12) United States Patent
Zhang et al.

(10) Patent No.: US 11,394,395 B1
(45) Date of Patent: Jul. 19, 2022

(54) TECHNIQUES FOR LINEARIZING DIGITAL-TO-ANALOG CONVERTERS IN SIGMA-DELTA ANALOG-TO-DIGITAL CONVERTERS

(71) Applicant: NXP B.V., Eindhoven (NL)

(72) Inventors: Chenming Zhang, Eindhoven (NL); Lucien Johannes Breems, Waalre (NL); Shagun Bajoria, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/158,857

(22) Filed: Jan. 26, 2021

(51) Int. Cl.
*H03M 3/00* (2006.01)
(52) U.S. Cl.
CPC ............. *H03M 3/37* (2013.01); *H03M 3/424* (2013.01); *H03M 3/464* (2013.01)
(58) Field of Classification Search
CPC ......... H03M 3/37; H03M 3/424; H03M 3/464
USPC .......................................... 341/118, 143, 155
See application file for complete search history.

(56) References Cited

U.S. PATENT DOCUMENTS

| | | | | |
|---|---|---|---|---|
| 7,535,392 B2 * | 5/2009 | Weng | ...................... | H03M 3/37 341/118 |
| 7,982,647 B2 * | 7/2011 | Souda | ..................... | H03M 3/37 341/143 |
| 9,035,813 B2 * | 5/2015 | Miglani | .................. | H03M 3/30 341/143 |
| 9,106,255 B1 * | 8/2015 | Zhang | ................... | H03M 3/496 |
| 10,439,633 B2 | 10/2019 | Breems et al. | | |
| 10,439,634 B2 | 10/2019 | Bolatkale et al. | | |
| 10,727,859 B1 | 7/2020 | Agrawal | | |
| 2019/0149164 A1 * | 5/2019 | Lien | ....................... | H03M 3/338 341/118 |
| 2019/0245553 A1 | 8/2019 | Bolatkale et al. | | |
| 2021/0203350 A1 | 7/2021 | Ng et al. | | |

OTHER PUBLICATIONS

Bolatkale, Muhammed et al., "A 4 GHz continuous-time Sigma-Delta ADC with 70 dB DR and -74 dBFS THD in 125 MHz BW," IEEE Journal of Solid-State Circuits, vol. 46, No. 12; Dec. 2011; pp. 2857-2868.

(Continued)

*Primary Examiner* — Khai M Nguyen

(57) ABSTRACT

The present disclosure relates generally to techniques for linearizing a digital-to-analog converter (DAC) in a continuous-time sigma-delta ADC. A sigma-delta ADC may be configured with a multibit quantizer for various applications. These applications may require wide-bandwidth high-resolution high-linearity power-efficient ADCs. In some embodiments, a mismatch of a multibit DAC might result in a bottleneck for achieving high linearity performance. Some linearization techniques may achieve high linearity performance. However, for a high-speed sigma-delta ADC, the DAC is configured to be part of a feedback loop. Existing linearization techniques often increase the delay in the feedback loop, which is not desired. Various aspects of the present disclosure provide improvement to linearization techniques by changing the references of the multibit quantizer. As a result, this reduces delay in the feedback loop of the sigma-delta modulator, which is beneficial for high-speed sigma-delta ADCs.

20 Claims, 5 Drawing Sheets

(56) References Cited

OTHER PUBLICATIONS

Cherry, J.A., et al., "Excess Loop Delay in Continuous-Time Delta-Sigma Modulators," IEEE Transactions on Circuits and Systems—II: Analog and Digital Signal Processing, vol. 46, No. 4, Apr. 1999; pp. 376-389.

Dong, Y. et al., "A Continuous-Time 0-3 MASH ADC achieving 88 dB DR With 53 MHz BW in 28 nm CMOS," IEEE Journal of Solid-State Circuits, vol. 49, No. 12; Dec. 2014; pp. 2868-2877.

Dong, Yunzhi et al., "A 72 dB-DR 465 MHz-BW Continuous-Time 1-2 MASH ADC in 28 nm CMOS," IEEE Journal of Solid-State Circuits, vol. 51, No. 12; Dec. 2016; pp. 2917-2927.

Jain, Ankesh et al., "Continuous-Time Delta-Sigma Modulators with Time-Interleaved FIR Feedback," IEEE Transactions on Circuits and Systems—I: Regular Papers, vol. 65, No. 2; Feb. 2018; pp. 434-442.

Srinivasan, Venkatesh et al., "A 20mW 61dB SNDR (60MHz BW) 1b Third-Order Continuous-Time Delta-Sigma Modulator Clocked at 6GHz in 45nm CMOS," 2012 IEEE International Solid-State Circuits Conference; Feb. 21, 2012; pp. 158-160.

Tang, Yongjian et al., "A 14 bit 200 MS/s DAC with SFDR > 78 dBc, IM3 > −83 dBc and NSD < −163 dBm/Hz Across the Whole Nyquist Band Enabled by Dynamic-Mismatch Mapping," IEEE Journal of Solid-State Circuits, vol. 46, No. 6; Jun. 2011; pp. 1371-1381.

Vadipour, Morteza, "Techniques for Preventing Tonal Behavior of Data Weighted Averaging Algorithm in Sigma-Delta Modulators," IEEE Transactions on Circuits and Systems—II: Analog and Digital Signal Processing, vol. 47, No. 11; Nov. 2000; pp. 1137-1144.

Wu, Su-Hai et al., "A 160MHz-BW 72dB-DR 40mW Continuous-Time Delta-Sigma Modulator in 16nm CMOS with Analog ISI Reduction Technique," IEEE International Solid-State Circuits Conference (ISSCC) Dig. Tech. Papers, 2016, pp. 280-281.

Yasuda, Akira et al., "A Third-Order Delta-Sigma Modulator Using Second-Order Noise-Shaping Dynamic Element Matching," IEEE Journal of Solid-State Circuits, vol. 33, No. 12; Dec. 1998; 8 pages.

U.S. Appl. No. 17/158,913, filed Jan. 26, 2021, entitled "Techniques for High-Speed Excess Loop Delay Compensation in Sigma-Delta Analog-To-Digital Converters."

Non-final office action dated Nov. 24, 2021 in U.S. Appl. No. 17/158,913.

Non-final office action dated Mar. 9, 2022 in U.S. Appl. No. 17/158,913.

Baluni, A., "Analysis and Design of a 20-MHz Bandwidth Continuous-Time Delta-Sigma Modulator with Time-Interleaved Virtual-Ground-Switched FIR Feedback", IEEE Journal of Solid-State Circuits, vol. 56, No. 3, Mar. 2021.

Jain, A., "Continuous-Time Delta-Sigma Modulators with Time-Interleaved FIR Feedback," IEEE Transactions on Circuits and Systems—I: Regular Papers, vol. 65, No. 2; Feb. 2018; pp. 434-443, published Sep. 8, 2017.

Caldwell, T., "A Reconfigurable ΔΣ ADC With Up to 100 MHz Bandwidth Using Flash Reference Shuffling", IEEE Transactions on Circuits and Systems—I: Regular Papers, vol. 61, No. 8, Aug. 2014.

Dayanik, M., "A 5GS/s 156MHz BW 70dB DR Continuous-Time Sigma-Delta Modulator with Time-Interleaved Reference Data-Weighted Averaging", 2017 Symposium on VLSI Circuits, Jun. 5-8, 2017.

Yang, W., "A 100mW 10MHz-BW CT ΔΣ Modulator with 87dB DR and 91dBc IMD", ISSCC 2008, Session 27, ΔΣ Data Converters, Mar. 3-7, 2008.

Zeng, T., "An Order-Statistics Based Matching Strategy for Circuit Components in Data Converters", IEEE Transactions on Circuits and Systems—I: Regular Papers, vol. 60, No. 1, Jan. 2013.

\* cited by examiner

TECHNIQUES FOR LINEARIZING DIGITAL-TO-ANALOG CONVERTERS IN SIGMA-DELTA ANALOG-TO-DIGITAL CONVERTERS

BACKGROUND

Sigma-delta modulation is a useful technique for encoding analog signals into digital signals for an analog-to-digital converter (ADC). A sigma-delta ADC may be configured with a multibit quantizer to support data encoding for various applications, such as cellular telecommunications (e.g., fourth generation (4G) systems, fifth generation (5G) systems). These applications may require wide-bandwidth high-resolution high-linearity power-efficient ADCs.

Some sigma-delta ADC designs employ a multi-bit digital-to-analog converter (DAC) in a feedback loop of the ADC. However, a mismatch between elements of a multibit DAC can cause non-linearities in DAC performance, limiting the accuracy of the ADC. Furthermore, existing linearization techniques often increase the delay in the feedback loop, which can negatively impact overall ADC performance.

SUMMARY

A sigma-delta modulator is described. The sigma-delta modulator may include a multibit quantizer configured with a mapping engine to perform one or more of a sorting, a mapping, and switching operating within the multibit quantizer. In some embodiments, the mapping engine is embedded within the multibit quantizer.

The sigma-delta modulator may further include a first summing node configured to subtract a feedback analog signal from a received input analog signal and generate a first analog output signal; a loop filter configured to receive and filter the first analog output signal from the first summing node; and a second summing node configured to subtract the feedback analog signal from the first filtered analog output signal and generate a second analog output signal, wherein the multibit quantizer is configured to receive the second analog output signal and a reference signal from the mapping engine to produce a digital output signal.

In some embodiments, the mapping engine is coupled between the reference signal and the multibit quantizer.

In some embodiments, the sigma-delta modulator may further include an excess loop delay (ELD) DAC configured to: receive the digital output signal via a feedback loop; covert the digital output signal to the feedback analog signal; and provide the feedback analog signal to the second summing node. In some embodiments, the ELD DAC is further configured to convert the digital output signal to the feedback analog signal.

In some embodiments, the sigma-delta modulator may further include a main DAC configured to receive the digital output signal via a feedback loop; covert the digital output signal to the feedback analog signal; and provide the feedback analog signal to the first summing node.

In some embodiments, the main DAC is further configured to provide the feedback analog signal as an input to a mismatch sensor via a direct signaling path between the main DAC and the mismatch sensor.

In some embodiments, the mismatch sensor is further configured to measure a static mismatch between unit elements of the main DAC; and provide measurement information including the measured static mismatch to a logic associated with the multi-bit continuous-time sigma-delta modulator.

In some embodiments, the mismatch sensor is further configured to measure a dynamic mismatch between unit elements of the main DAC; and provide measurement information including the measured dynamic mismatch to a logic associated with the multi-bit continuous-time sigma-delta modulator.

In some embodiments, the logic is further configured with a sorting algorithm, a mapping algorithm, or a switching algorithm, or any combination thereof.

In some embodiments, the mapping engine is further configured to apply one or more of the sorting algorithm, the mapping algorithm, or the switching algorithm, or any combination thereof, to the reference.

In some embodiments, the mapping engine is external to a feedback loop of the multi-bit continuous-time sigma-delta modulator and is further configured to provide a linearization of the multi-bit continuous-time sigma-delta modulator without an output from the multibit quantizer.

In some embodiments, a feedback loop of the multi-bit continuous-time sigma-delta modulator comprises a set of per-bit parallel loops, each loop configured to provide a per-bit signal summation of the filtered analog output signal such that an output of the multiple per-bit parallel loops is a multi-bit quantization digital output signal.

A device is described. The device includes a first summing node configured to subtract a feedback analog signal from a received input analog signal and generate a first analog output signal; a loop filter configured to receive and filter the first analog output signal from the first summing node; a multilevel quantizer including a plurality of slices coupled to the loop filter to receive the filtered signal and output a digital output signal, each slice of the plurality of slices includes an amplifier coupled to a second summing node, a latch coupled to the second summing node, an ELD DAC coupled to the second summing, and a reference DAC coupled to the second summing node, wherein the reference DAC is configured to receive from a mapping engine a set of output reference codes.

In some embodiments, the mapping engine is further configured to receive the digital output signal as feedback via a feedback loop plus the set of input codes to provide the set of output codes to the reference DAC.

In some embodiments, the digital output signal comprises a multibit quantization digital output signal.

In some embodiments, a feedback loop of the device comprises a set of per-bit parallel loops, each loop configured to provide a per-bit signal summation of the filtered analog output signal such that an output of the multiple per-bit parallel loops is a multi-bit quantization digital output signal.

In some embodiments, the device may further include a set of respective latches configured to provide an output of the multiple per-bit parallel loops to provide a multi-bit quantization digital output signal.

In some embodiments, the multibit quantizer is a multilevel quantizer including a number of slices of 1-bit comparator latches and a number of duplicate ELD summation nodes.

In some embodiments, the reference DAC is configured to convert a number of reference codes into a reference current, wherein the mapping engine further comprises a number of switches to connect a set of input codes to the set of output reference codes based on a selected order.

A method may be described. The method may include filtering, via a filter of a sigma-delta modulator, a first analog output signal; subtracting, via a summing node of the sigma-delta modulator, a feedback analog signal from the filtered analog output signal; generating, via an output of the summing node of the sigma-delta modulator, a second analog output signal; and receiving, via a multibit quantizer of the sigma-delta modulator, the second analog output signal and a reference signal from a mapping engine to produce a digital output signal, wherein the mapping engine is coupled between the reference signal and the multibit quantizer.

In some embodiments, the mapping engine is further configured to receive the digital output signal as feedback via a feedback loop plus a set of input codes to provide a set of output codes to a reference DAC.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

DETAILED DESCRIPTION

Figure 1:
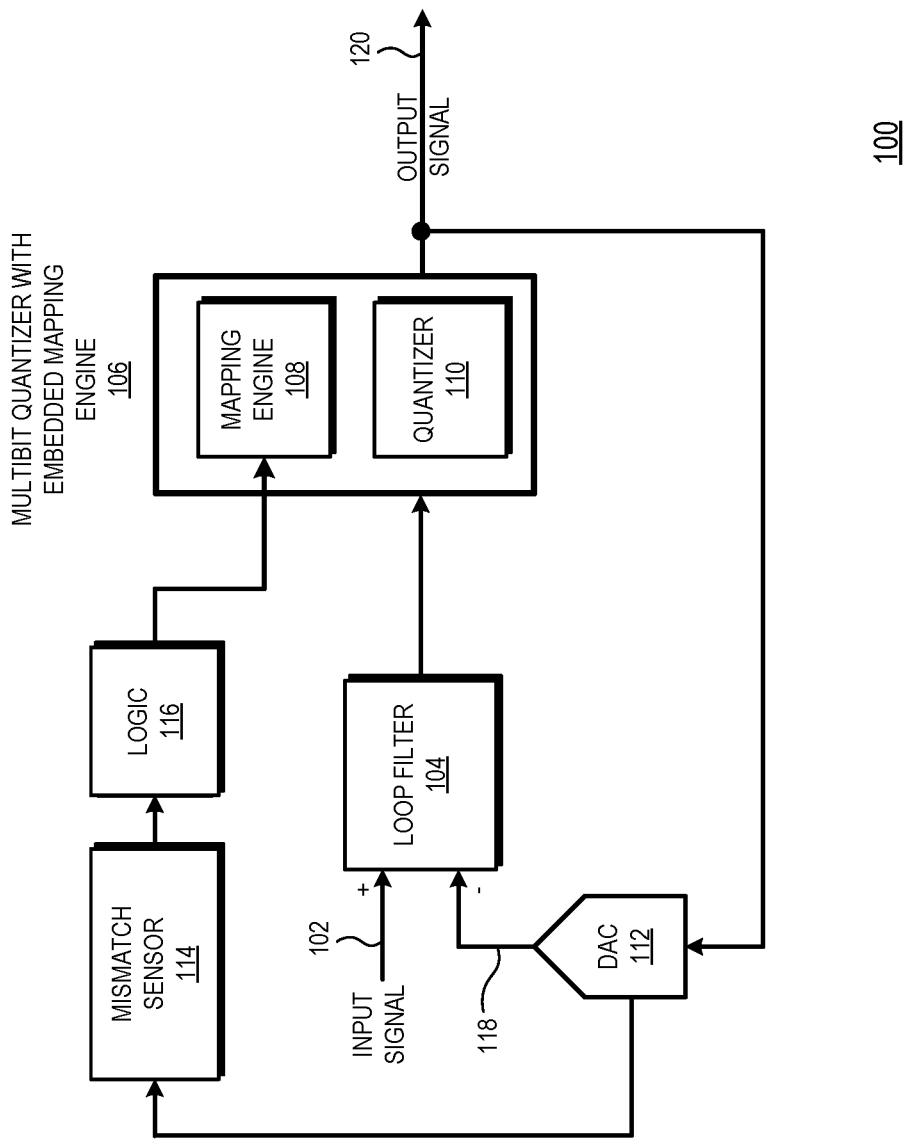
FIG. 1 is a block diagram of a continuous-time sigma-delta ADC in accordance with some embodiments.

Various aspects of the present disclosure relate to techniques for linearizing a DAC in a continuous-time sigma-delta ADC. In an ADC, an analog signal may be sampled with a sampling frequency and subsequently quantized into a digital signal. In some embodiments, this may introduce a quantization error noise. The continuous-time sigma-delta ADC may perform delta modulation, which may encode the change in the signal (i.e., delta), rather than the absolute value. The result is a stream of pulses, as opposed to a stream of numbers, as is the case with pulse code modulation. In sigma-delta modulation, the accuracy of the modulation is improved by passing the digital output through a DAC and adding (sigma) the resulting analog signal, to the input signal (i.e., the signal before delta modulation), thereby reducing the error introduced by the delta-modulation.

Continuous-time sigma-delta ADCs include one or multiple sigma-delta modulators (SDMs). An SDM is a feedback loop containing a loop filter, a quantizer, and a feedback DAC(s). The function of the quantizer is sampling and quantization. Its input signal is continuous in time domain and continuous in voltage (or current) domain, (i.e., a continuous-time, continuous-value (analog signal)). Its output signal may be discrete in time domain and discrete in voltage domain (i.e., discrete-time discrete-value (digital signal)). The function of the main feedback DAC is a zero-order hold, which converts the digital signal to analog signal.

Sigma-delta ADCs with multi-bit quantization are popular for a lot of applications which need wide-bandwidth high-resolution high linearity power-efficient ADCs. To achieve high linearity, the mismatch of the multibit DAC is often a bottleneck. There are some linearization techniques for high-linearity DACs, such as sorting, data weighted averaging, randomization, etc. However in the highspeed sigma-delta ADCs, the DAC is in a feedback loop. In some embodiments, the DAC linearization techniques may increase the delay in the feedback loop, which is not desired. Various aspects of the present disclosure provide improvement to linearization techniques by changing the references of the multibit quantizer. As a result, this reduces delay in the feedback loop of the sigma-delta modulator, which is beneficial for high-speed sigma-delta ADCs.

For example, a mapping engine is typically in the main feedback loop of the SDM, and more specifically the mapping engine is between the quantizer and the main DAC. In the present disclosure, the mapping engine is not part of the main feedback loop of the SDM. By sorting, mapping, and switching of the reference code of the reference DAC, a corresponding sorting, mapping, and switching of the unit element of the main DAC is achieved. If the mapping engine needs the quantizer output as an input, the mapping engine is between the quantizer and the reference DAC, but out of the main feedback loop. Because the mapping engine is not in the main feedback loop, the delay of the mapping engine also does not contribute to the total loop delay of the SDM main feedback loop. In the case that the mapping engine needs the quantizer output information, the SDM main feedback loop and the DAC linearization loop are partially decoupled, and hence can be separately optimized.

FIG. 1 is a block diagram of a continuous-time sigma-delta ADC 100 in accordance with some embodiments. The continuous-time sigma-delta ADC 100 may implement a feedforward, or feedback, or a hybrid feedforward-feedback SDM architecture. In the following description of the continuous-time sigma-delta ADC 100, certain components may be added or omitted from the continuous-time sigma-delta ADC 100. The continuous-time sigma-delta ADC 100 may support analog-to-digital conversion of signals by processing a signal over one or more components of the continuous-time sigma-delta ADC 100. The continuous-time sigma-delta ADC 100 may include a loop filter 104, a multibit quantizer 106, a DAC 112, a mismatch sensor 114, and a logic 116. In the example of FIG. 1, the multibit quantizer 106 is embedded with a mapping engine 108. The multibit quantizer 106 thereby includes the mapping engine 108 and a quantizer 110.

One or more of the components of the continuous-time sigma-delta ADC 100 may be coupled (e.g., operatively, communicatively, functionally, electronically) to each other. One or more of the components of the continuous-time sigma-delta ADC 100 may include one or more inputs and one or more outputs. In some embodiments, the loop filter 104 may include multiple inputs. For example, the loop filter 104 may include a first input configured to receive an input signal 102 (e.g., an analog signal) and a second input coupled to an output of the DAC 112 to receiver another signal (e.g., a feedback signal 118). The loop filter 104 may also include an output that is coupled to a first input of the multibit quantizer 106. For example, the output of the loop filter 104 may be coupled to an input of the quantizer 110.

The multibit quantizer 106 may include an output configured to output a signal 120 (e.g., a digital signal). In some embodiments, the output of the multibit quantizer 106 may be coupled to an input of the DAC 112. In some embodiments, the DAC 112 may include a second output coupled to an input of the mismatch sensor 114. An output of the mismatch sensor 114 may be coupled to an input of the logic 116. In some embodiments, the mismatch sensor 114 may measure a static mismatch or a dynamic mismatch, or both, between elements of the DAC 112 as described herein. The logic 116 may be configured with various algorithms including: a sorting algorithm, a mapping algorithm, or a switching algorithm, and the like to support linearization for the continuous-time sigma-delta ADC 100. In some embodiments, an output of the logic 116 may be coupled to a second input of the multibit quantizer 106. For example, the output of the logic 116 may be coupled to an input of the mapping engine 108 embedded within the multibit quantizer 106. The mapping engine 108 may be coupled to the quantizer 110 within the multibit quantizer 106. The mapping engine 108 may be configured with one or more circuit elements, such as switches to support linearization techniques as described herein.

Figure 2:
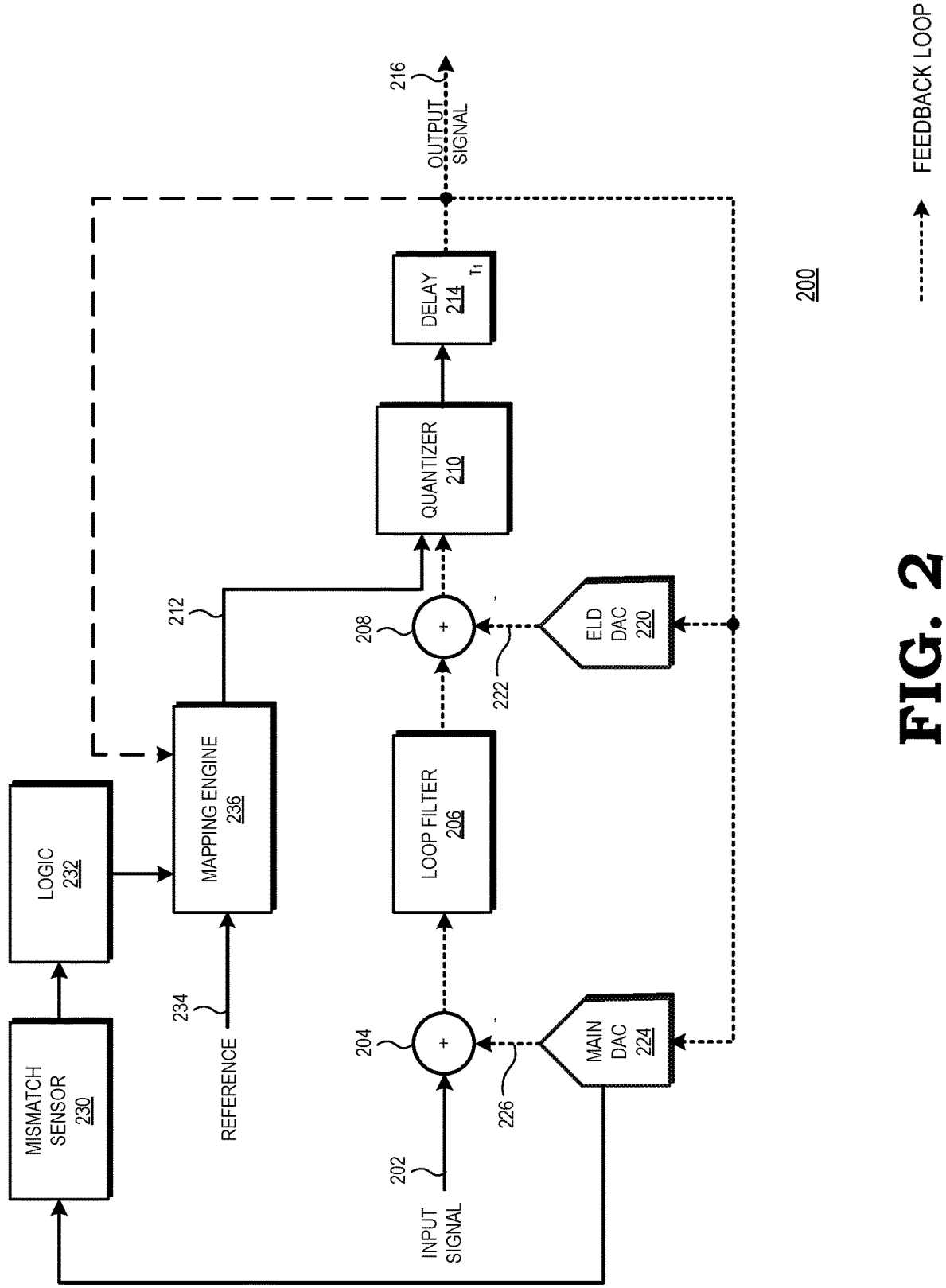
FIG. 2 is a block diagram of a continuous-time sigma-delta ADC in accordance with some embodiments.

FIG. 2 is a block diagram of a continuous-time sigma-delta ADC 200 in accordance with some embodiments. The continuous-time sigma-delta ADC 200 may implement a feedforward SDM architecture. In the following description of the continuous-time sigma-delta ADC 200, certain components may be added or omitted from the continuous-time sigma-delta ADC 200. The continuous-time sigma-delta ADC 200 may support analog-to-digital conversion of signals by processing a signal over one or more components of the continuous-time sigma-delta ADC 200. The continuous-time sigma-delta ADC 200 may include a set of summing nodes (e.g., a summing node 204 and a summing node 208), a loop filter 206, a quantizer 210 associated with a corresponding delay 214, an excess loop delay (ELD) compensation DAC 220, a main DAC 224, a mismatch sensor 230, a logic 232, and a mapping engine 236. In some embodiments, the continuous-time sigma-delta ADC 200 may provide a feedback loop, which may include one or more of the components (e.g., the second input of the summing node 204, both the input and the output of the loop filter 206, all of the inputs of the summing node 208, the first input of the quantizer 210, both the input and the output of the ELD DAC 220, both the input and the output of the main DAC 224, and the first input of the mapping engine 236) of the continuous-time sigma-delta ADC 200, as described herein.

One or more of the components of the continuous-time sigma-delta ADC 200 may be coupled (e.g., operatively, communicatively, functionally, electronically) to each other. One or more of the components of the continuous-time sigma-delta ADC 200 may include one or more inputs and one or more outputs. The summing node 204 may include one or more inputs, such as a first input to receive a signal and a second input coupled to a first output of the main DAC 224 to receive another signal. The summing node 204 may also include an output coupled to an input of the loop filter 206 to output a signal to the loop filter 206. The loop filter 206 may also include an output that is coupled to a first input of the summing node 208 to receive a signal from the loop filter 206. The summing node 208 may also include a second input coupled to an output of the ELD DAC 220 to receive a signal from the ELD DAC 220. The quantizer 210 may include one or more inputs, for example, a first input coupled to an output of the summing node 208 to receive a signal from the summing node 208, and a second input coupled to an output of the mapping engine 236 to receive a signal from the mapping engine 236.

The quantizer 210 may also include an output that is coupled to an input of the delay 214 to output a signal to the delay 214, which may include one or more outputs including a first output to provide an output signal 216, a second output coupled to a first input of the mapping engine 236 to output a signal to the mapping engine 236, and a third output coupled to an input of the ELD DAC 220 to output a signal to the ELD DAC 220 and an input to the main DAC 224 to output a signal to the main DAC 224. The main DAC 224 may also include a second output coupled to an input of the mismatch sensor 230 to output signal to the mismatch sensor 230, which may include an output coupled to an input of the logic 232 to output a signal to the logic 232. The logic 232 may include an output that is coupled to a second input of the mapping engine 236 to output a signal to the mapping engine 236. Additionally, the mapping engine 236 may include a third input to receive a reference signal 234.

In the example of FIG. 2, the summing node 204 may receive, via the first input, an input signal 202, which may be an analog signal. The summing node 204 may also receive, via the second input, a main feedback signal 226 from the output of the main DAC 224. The summing node 204 may be configured to add or subtract signals, for example, add or subtract the input signal 202 from the main feedback signal 226 to produce a resultant signal. The summing node 204 may provide, via the output of the summing node 204, the resultant signal to the input of the loop filter 206. The loop filter 206 may be made up of one or more circuit elements. For example, the loop filter 206 may be made up of one or more resistors and capacitors. The loop filter 206 may also be associated with a respective transfer function that models the continuous-time sigma-delta ADC 200.

The loop filter 206 may provide, via the output of the loop filter 206, a filtered signal to the first input of the summing node 208. The summing node 208 may also receive, via the second input, a feedback ELD compensation signal 222 from the output of the ELD DAC 220. The summing node 208 may be configured to add or subtract signals, for example, add or subtract the filtered signal from the feedback ELD compensation signal 222 to produce a resultant signal. The summing node 208 may provide, via the output of the summing node 208, the resultant signal to the first input of the quantizer 210, which may also receive a resultant signal 212 at the second input of the quantizer from the output of the mapping engine 236. The quantizer 210 may convert the analog output of the summing node 208 into digital code.

The mapping engine 236 may be configured to receive, via the third input, a reference signal 234. The mapping engine 236 may also be configured to receive, via the second input, a resultant signal from the output of the logic 232. Additionally, or alternatively, the mapping engine 236 may also be configured to receive, via the first input, a feedback signal 216 from the output of the delay 214. In some embodiments, the mismatch sensor 230 may measure a static mismatch or a dynamic mismatch, or both, between elements of the main DAC 224. The mapping engine 236 may be configured with one or more circuit elements, such as switches to support linearization techniques.

The logic 232 may be configured with various algorithms including: a sorting algorithm, a mapping algorithm, or a switching algorithm, and the like to support linearization for the continuous-time sigma-delta ADC 200. As illustrated in the example of FIG. 2, instead of configuring the mapping engine 236 to be between the quantizer 210 and the main DAC 224, the mapping engine 236 is configured between the reference 234 and the quantizer 210 (e.g., a multibit quantizer). The analog signal output from the summing node 208 and the resultant signal 212 from the mapping engine 236 may be input to the quantizer 210 (e.g., a multibit quantizer) and an input to a delay 214 associated with the quantizer 210 ($\tau_1$ is the delay 214 of the quantizer 210). The output of the delay 214 may be the output signal 216 of the continuous-time sigma-delta ADC 200.

In the example of FIG. 2 the DACs (e.g., the main DAC 224, the ELD DAC 220) have non-linearities, and these non-linearities are the result of mismatches in elements of the DAC (e.g., the main DAC 224, the ELD DAC 220), the mismatch sensor 230 detects the mismatches in the DAC elements (e.g., the main DAC 224, the ELD DAC 220), based on the information received from the logic 232 or the output signal 216, or both, the mapping engine 236 may be configured to adjust (e.g., change) an order of how the reference is connected to the quantizer 210. Additionally, the mapping engine 236 may generate a map of the non-linearities, and to generate a correction signal for the quantizer 210 based on the identified non-linearities.

In some embodiments, the quantizer 210 (e.g., a multibit quantizer) may be implemented as a flash sub-ADC. This flash sub-ADC may be configured to compare the input signal of the quantizer 210 (which may be the output signal of the summing node 208) with a series of reference (e.g., reference voltages or reference currents). The unit 1-bit comparator in the flash sub-ADC (e.g., multibit quantizer 210) and unit element of the main DAC 224 may be one-to-one connected through a connection circuitry (e.g., samplers, buffers, D-flipflops, etc.). By sorting, mapping, or switching, or any combination thereof, the reference among the unit 1-bit comparators, an effective sorting, mapping, or switching, or any combination thereof of the unit elements of the main DAC 224 may be achieved. Therefore, as illustrated in FIG. 2, the mapping engine 236 is not in the main feedback loop between the quantizer 210 and the DACs 220 and 224, reducing the loop delay and improving the performance of the continuous-time sigma-delta ADC 200.

Figure 3:
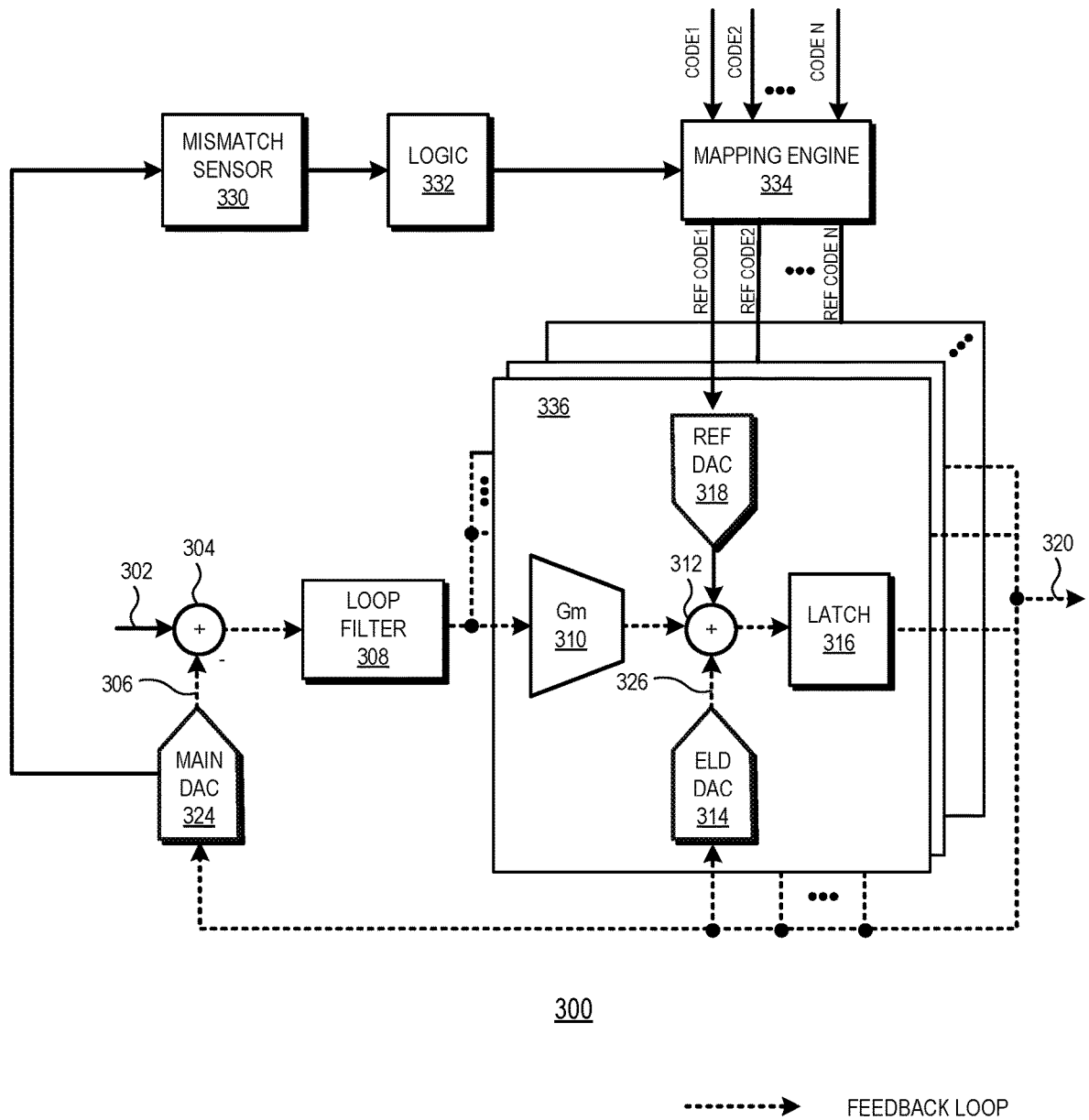
FIG. 3 is a block diagram of a continuous-time sigma-delta ADC in accordance with some embodiments.

FIG. 3 is a block diagram of a continuous-time sigma-delta ADC 300 in accordance with some embodiments. In the following description of the continuous-time sigma-delta ADC 300, certain components may be added or omitted from the continuous-time sigma-delta ADC 300. The continuous-time sigma-delta ADC 300 may implement aspects of the continuous-time sigma-delta ADC 100 as described in FIG. 1. For example, the continuous-time sigma-delta ADC 300 may implement a feedforward SDM architecture. The continuous-time sigma-delta ADC 300 may include summing nodes, such as a summing node 304 and a summing node 312, which may be configured to add or subtract signals. The continuous-time sigma-delta ADC 300 may include a loop filter 308, which may be made up of one or more circuit elements (e.g., one or more resistors, capacitors, inductors, etc.). The continuous-time sigma-delta ADC 300 may also include an amplifier 310, an ELD DAC 314, a reference (REF) DAC 318, a latch 316, a main DAC 324, a mismatch sensor 330, a logic 332, and a mapping engine 334. One or more of the components of the continuous-time sigma-delta ADC 300 may be coupled (e.g., operatively, communicatively, functionally, electronically) to each other. In some embodiments, the continuous-time sigma-delta ADC 300 may provide a feedback loop, which may include one or more of the components of the continuous-time sigma-delta ADC 300, as described herein.

The summing node 304 may include one or more inputs, such as a first input to receive a signal and a second input coupled to a first output of the main DAC 324 to receive another signal. The summing node 304 may also include an output coupled to an input of the loop filter 308 to output a signal to the loop filter 308. The loop filter 308 may also include an output that is coupled to an input of the amplifier 310 to receive a signal from the loop filter 308. The summing node 312 may include one or more inputs, including a first input coupled to an output of the amplifier 310, a second input coupled to an output of the REF DAC 318 to receive a signal from the REF DAC 318, and a third input coupled to an output of the ELD DAC 314 to receive a signal from the ELD DAC 314. The amplifier 310 (e.g., a Gm cell also referred to as a transconductance amplifier) may convert a voltage signal into a current signal.

The summing node 312 may include an output coupled to an input of the latch 316. The latch 316 may include an output to provide an output signal (e.g., output signal 320). The output of the latch 316 may be coupled to an input of the ELD DAC 314 and an input to the main DAC 324. The main DAC 324 may include a second output coupled to an input of the mismatch sensor 330, which may include an output coupled to an input of the logic 332. The logic 332 may include an output coupled to a first input of the mapping engine 334. The mapping engine 334 may include a set of second inputs to receive a set of codes, and a set of outputs to provide reference codes to an input of the REF DAC 318.

In the example of FIG. 3, the continuous-time sigma-delta ADC 300 may support a linearization technique (e.g., a DAC linearization technique) that may not involve a quantizer 320 output. In some embodiments, the DACs (e.g., the main DAC 324, the ELD DAC 314, etc.) may include non-linearities that need to be corrected, and these non-linearities may be the result of mismatches in elements of the DAC (e.g., the main DAC 324, the ELD DAC 314). The mismatch sensor 330 may detect the mismatches in the DAC elements (e.g., the main DAC 324, the ELD DAC 314), and provide these as input to the mapping engine 334, which may change the order of how the one or more codes (e.g. Codes 1, . . . , Code N) are connected to one or more reference codes (e.g., a ref code 1, . . . , a ref code N).

In some embodiments, the mapping engine 334 may be positioned external to the feedback loop of the continuous-time sigma-delta ADC 300. One or more operations including sorting, mapping, or switching, or any combination thereof of unit elements of the main DAC 324 may be achieved by sorting, mapping, or switching, or any combination thereof of the current reference of a multi-bit quantizer 320. As illustrated in FIG. 3, an n+1 level quantizer 320 is shown. The n+1 level quantizer 320 may include n slices of 1-bit comparators (i.e., latches 316) and a duplicated current-mode excess loop delay (e.g., the ELD DAC 314) at summation nodes 312. In some embodiments, the REF DAC 318 converts the reference code (referred to as ref code) into a reference current.

The n+1 level quantizer 320 may haven reference codes, which may be, for example, code 1, code 2, . . . , code n. In some embodiments, the mapping engine 334 may be configured with one or more switches to connect the input code 1, code 2, . . . , code n to the output ref code 1, ref code 2, . . . , ref code n. In some other embodiments, the mapping engine 334 may be configured with one or more switches to connect the input code 1, code 2, . . . , code n to the output ref code 1, ref code 2, . . . , ref code n based on a selected order. Thus, a particular operation, for example, sorting, mapping, or switching, or any combination thereof can be implemented through the connection from the input code to the output code of the mapping engine 334. The 1-bit comparator (e.g., the latch 316) and the 1-bit unit DAC 318 may be one-to-one connected. By sorting, mapping, or switching, or any combination thereof of the reference code of the quantizer 320, an equivalent sorting, mapping, or switching, or any combination thereof of unit elements of a DAC (e.g., the ELD DAC 314, the main DAC 324) may be effectively achieved.

The continuous-time sigma-delta ADC 300 may support linearization techniques that might not need information from a quantizer 320 output. In some examples, the continuous-time sigma-delta ADC 300 may perform a sorting linearization technique or a mapping linearization technique, or both. In these examples, with the measured information on a static and a dynamic mismatch of unit elements of a DAC (e.g., the ELD DAC 314, the REF DAC 318, the main DAC 324), a certain order of the unit elements of the DAC (e.g., the ELD DAC 314, the REF DAC 318, the main DAC 324) may be calculated by the logic 332. This order may be fixed in the operation of the DAC. In some embodiments, the mapping engine 334 may be configured to implement a fixed connection with a certain optimal order between the input code and the output code. In this case, as the mapping engine 334 is not switched during the operation of the continuous-time sigma-delta ADC 300, its delay is not harmful.

Some linearization techniques, such as switching linearization techniques might not need information from a quantizer 320 output, for example, a randomization linearization technique. In this example, the order of unit elements of a DAC (e.g., the ELD DAC 314, the REF DAC 318, the main DAC 324) is randomly switched. In this case, after the switching, for example, the REF DAC 318 output current and the comparator input may be settled before the next sampling moment of the comparator. Thus, in this case, the delay of the mapping engine 334 when a switching happens may be less than one sampling clock period of the continuous-time sigma-delta ADC 300. As illustrated in FIG. 3, the main feedback loop and ELD feedback loop of the continuous-time sigma-delta ADC 300 are speed critical and sensitive to extra delay. The REF DAC 318 and the mapping engine 334 are configured for the DAC linearization technique. For the case that the mapping engine 334 is switching during the operation of the continuous-time sigma-delta ADC 300, in some embodiments, the REF DAC 318 and the mapping engine 334 have maximally one sampling clock period to settle when the switching happens.

Figure 4:
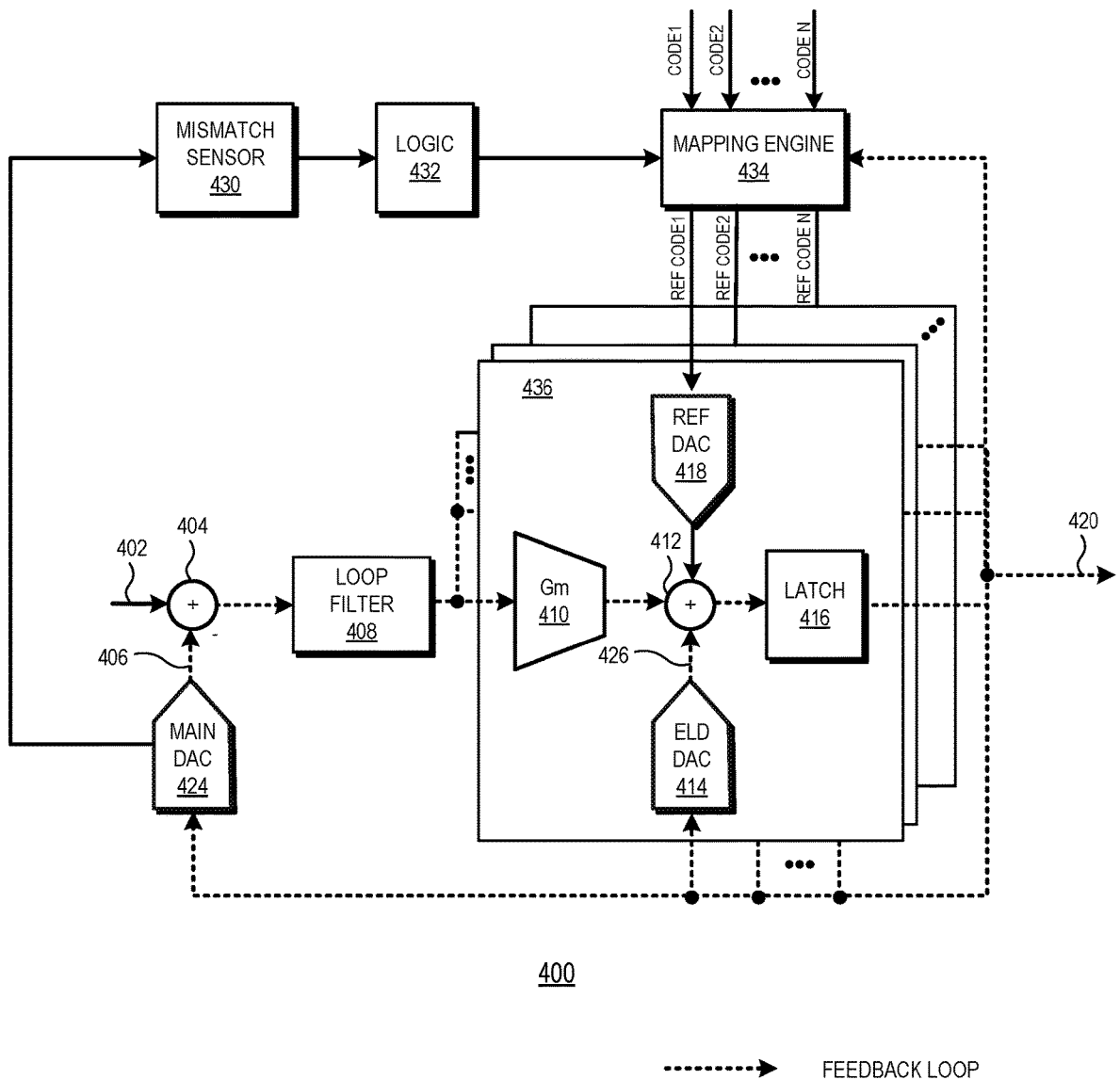
FIG. 4 is a block diagram of a continuous-time sigma-delta ADC in accordance with some embodiments.

FIG. 4 is a block diagram of a continuous-time sigma-delta ADC 400 in accordance with some embodiments. In the following description of the continuous-time sigma-delta ADC 400, certain components may be added or omitted from the continuous-time sigma-delta ADC 400. The continuous-time sigma-delta ADC 400 may implement aspects of the continuous-time sigma-delta ADC 100 as described in FIG. 1. For example, the continuous-time sigma-delta ADC 400 may implement a feedforward SDM architecture. The continuous-time sigma-delta ADC 400 may include summing nodes, such as a summing node 404 and a summing node 412, which may be configured to add or subtract signals. The continuous-time sigma-delta ADC 400 may include a loop filter 408, which may be made up of one or more circuit elements (e.g., one or more resistors, capacitors, inductors, etc.). The continuous-time sigma-delta ADC 400 may also include an amplifier 410, an ELD DAC 414, a REF DAC 418, a latch 416, a main DAC 424, a mismatch sensor 430, a logic 432, and a mapping engine 434. One or more of the components of the continuous-time sigma-delta ADC 400 may be coupled (e.g., operatively, communicatively, functionally, electronically) to each other. In some embodiments, the continuous-time sigma-delta ADC 400 may provide a feedback loop, which may include one or more of the components of the continuous-time sigma-delta ADC 400, as described herein.

The summing node 404 may include one or more inputs, such as a first input to receive a signal and a second input coupled to a first output of the main DAC 424 to receive another signal. The summing node 404 may also include an output coupled to an input of the loop filter 408 to output a signal to the loop filter 408. The loop filter 408 may also include an output that is coupled to an input of the amplifier 410 to receive a signal from the loop filter 408. The summing node 412 may include one or more inputs, including a first input coupled to an output of the amplifier 410 to receive an amplified signal, a second input coupled to an output of the REF DAC 418 to receive a signal from the REF DAC 418, and a third input coupled to an output of the ELD DAC 414 to receive a signal from the ELD DAC 214.

The summing node 412 may include an output coupled to an input of the latch 416. The latch 416 may include an output to provide an output signal (e.g., output signal 420). The output of the latch 416 may be coupled to an input of the ELD DAC 414 and an input to the main DAC 424. The main DAC 424 may include a second output coupled to an input of the mismatch sensor 430, which may include an output coupled to an input of the logic 432. The logic 432 may include an output coupled to a first input of the mapping engine 434. The mapping engine 434 may include a set of second inputs to receive a set of codes, and a set of outputs to provide reference codes to an input of the REF DAC 418. Additionally, the mapping engine 434 may include third input coupled to the output of the latch 416 to receive the output signal 420.

Thus, in the example of FIG. 4, the output signal 420 is also an input of the mapping engine 434. Some examples of these type of DAC linearization techniques are dynamic weighted averaging linearization techniques and randomized dynamic weighted averaging linearization techniques. In the example of FIG. 4, the main feedback loop of the sigma-delta modulator and the DAC linearization loop are (partially) decoupled. The DAC linearization loop may include the comparator (i.e., the latch 416), the mapping engine 434, the REF DAC 418, and the ELD summation node 412. The SDM main feedback loop may include the comparator (i.e., the latch 416), the main DAC 424, the loop filter 408, the Gm-cell (i.e., the amplifier 410) and the ELD summation node 412. Thus, the SDM main feedback loop and the DAC linearization loop can be optimized separately for their different requirements.

In some embodiments, for example, the main DAC 424 may have a noise and matching requirement. Thus, unit elements of the main DAC 424 may be within relatively large current (e.g., for lower thermal noise) and relatively large area (for better matching and lower flicker noise). In some embodiments, the REF DAC 418 in the multi-bit quantizer may have a relaxed noise and matching requirement than the main DAC 424, as the noise and non-linearity contributed by the REF DAC 418 is noise-shaped by the SDM. Thus, it may be beneficial to configure the mapping engine 434 to be between the comparator and the REF DAC 418, compared to some approaches where the mapping engine may be configured between the comparator and the main DAC 424.

As illustrated in FIG. 4, the continuous-time sigma-delta ADC 400 may include the main feedback loop, the ELD feedback loop and the DAC linearization loop of the SDM. In some embodiments, the total delay of the DAC linearization loop may be maximally one sampling clock period. In some embodiments, the total delay of the main feedback loop may also be maximally one sampling clock period. In some embodiments, unit elements of the main DAC 424 may not be selected based on the current sample of the quantizer output. Rather, an order of the unit element of the main DAC 424 may be selected to be used based on the previous sample of the quantizer output.

Figure 5:
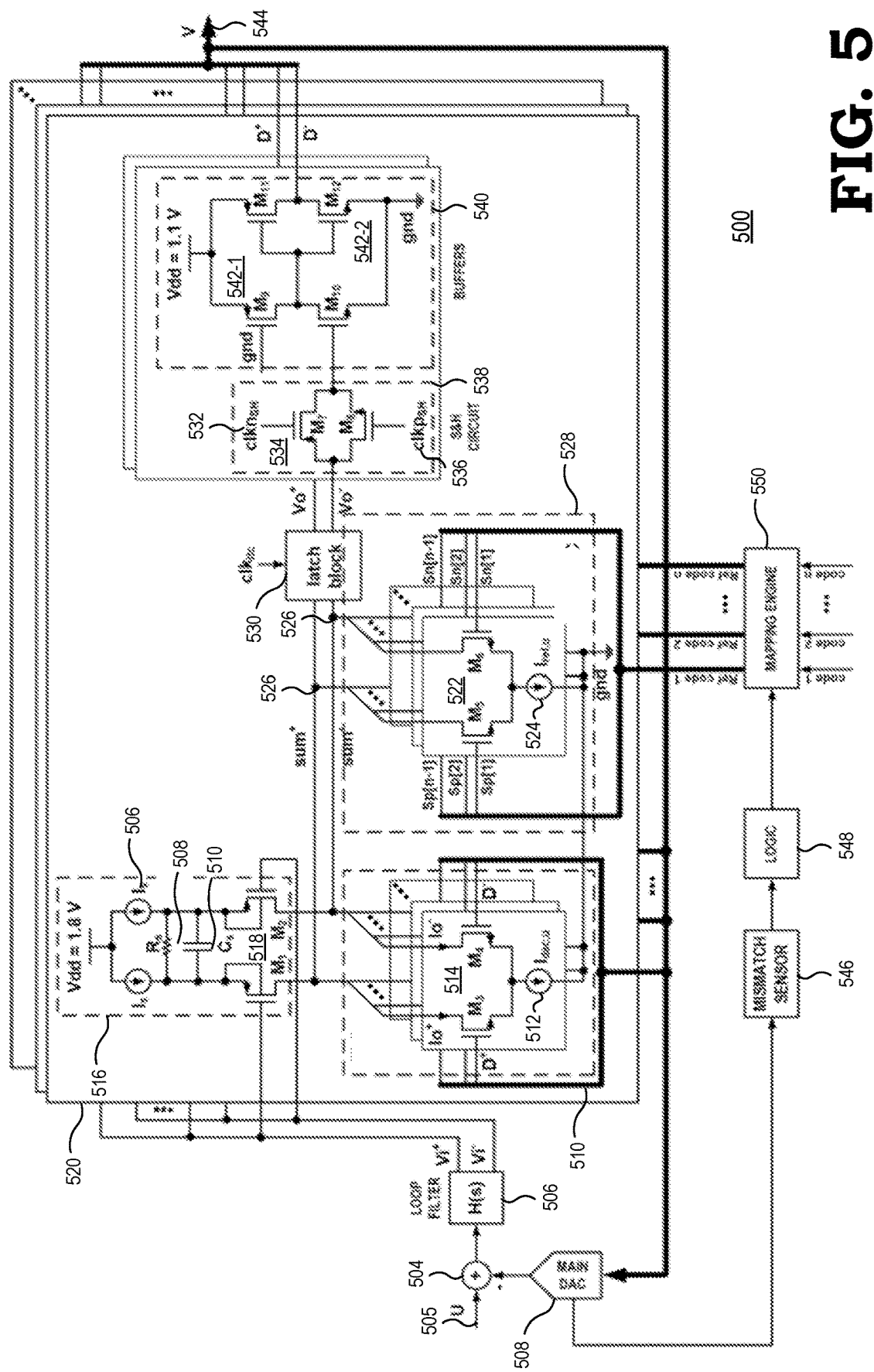
FIG. 5 is a block diagram of a continuous-time sigma-delta ADC in accordance with some embodiments.

FIG. 5 is a block diagram of a transistor-level implementation of a continuous-time sigma-delta ADC 500 in accordance with some embodiments. In the following description of the continuous-time sigma-delta ADC 500, certain components may be added or omitted from the continuous-time sigma-delta ADC 500. The continuous-time sigma-delta ADC 500 may support one or more linearization techniques, for example DAC linearization techniques. In some embodiments, the continuous-time sigma-delta ADC 500 may support a linearization technique that does not need a quantizer output.

In the example transistor-level implementation, a Gm cell, an ELD DAC 510, an associated reference current 528, a latch 530, a sample and hold (S&H) circuit 538 and buffers 540 compose a slice of an ELD-compensated quantizer. The transistor-level circuit implementation of the proposed continuous-time sigma-delta ADC 500 shows the $m^{th}$ slice of the duplicated summation node and 1-bit comparator in detail. In the example of FIG. 5, the SDM uses (n+1)-level quantization. So the SDM has n total slices of duplicated summation node and 1-bit comparator.

In some embodiments, the loop filter 506 has differential voltage outputs Vi$^+$ and Vi$^-$. These differential voltage signals are converted to differential current signals with a source-degenerated transconductance (Gm) stage 516. In some embodiments, the Gm cell may be implemented as a source degenerated PMOS transconductance amplifier, which is composed of current sources $I_s$ 506, source-degeneration resistor $R_s$ 508, a capacitor $C_s$ 510, and thin-oxide PMOS transistors $M_1$, $M_2$ 518. In some embodiments, source degeneration may be employed to improve the linearity of the Gm cell for a large input swing of ±250 mV. The capacitor $C_s$ may be added at the source of $M_1$, $M_2$ 518 to generate a zero in the transfer function of the Gm stage 516 (V/I converter), and to compensate its phase shift/delay. The current source $I_s$ 506 may be, for example, implemented as a cascaded PMOS current source.

The bandwidth of the Gm cell may, in some embodiments, affect the stability of the outer feedback loop, but not the fast feedback loop. The ELD DAC 510 may be implemented as a current steering DAC. The NMOS switches $M_3$, $M_4$ 514 and the current source $I_{dac,u}$ 512 may compose a unit ELD DAC. The NMOS transistors $M_5$, $M_6$ 522 and the current source $I_{ref,u}$ 524 may construct the unit reference DAC (Ref DAC). In some embodiments, for n+1-level quantization, n reference levels may need to be created, and thus n−1 reference current units may be required for every slice. The reference DAC converts a digital input code—reference code, into an output current. The n+1-level quantizer shown in FIG. 5 has n reference codes—ref code 1, ref code 2, . . . , ref code n. These n reference codes may be a permutation of the n input codes {code 1, code 2, . . . , code n}. The mapping engine 550 applies a certain sorting operation, mapping operation, and/or a switching operation on the connection from the input code {code 1, code 2, . . . , code n} to its output code {ref code 1, ref code 2, . . . , ref code n}.

The ELD DAC may be an n+1-level current steering DAC, which is composed by NMOS transistors $M_3$-$M_4$ 514 and current sources $I_{dac,u}$ 512. The ELD DACs are implemented similarly as the reference DACs, but their switches are controlled by the digital output of the n+1-level quantizer. The current sources in the reference DACs and ELD DACs can be for example implemented as cascaded NMOS current sources.

After the latch block, a transmission gate ($M_7$, $M_8$ 534) with complementary sampling clocks (clkp$_{SH}$ 536 and clkn$_{SH}$ 532) is employed to sample the latch output at the end of the latch 530. In some embodiments, two buffers 540 are inserted between the sampled latch output and the input of the ELD DACs. The choice of a number of buffers is a trade-off between minimizing the load capacitance of the latch, and reducing the delay of the buffers. The first buffer ($M_9$, $M_{10}$ 542-1) is a NMOS buffer with PMOS load, while the second buffer ($M_{11}$, $M_{12}$ 542-2) is a CMOS buffer. In some embodiments, the NMOS buffer may have lower input capacitance than the CMOS buffer, but it consumes more power. The CMOS buffer offers rail-to-rail driving ability. For the n+1-level quantization, one sampled latch output node should drive n unit ELD DACs after two buffers. As such, the latch output is sampled by the S&H circuit (pass gate $M_7$-$M_8$) with the sampling clock clk$_{SH}$. After that, the sampled quantizer output goes through two buffers composed by the $M_9$-$M_{12}$. The first buffer composed by $M_9$-$M_{10}$ is a NMOS buffer with PMOS load. The second buffer composed by $M_{11}$-$M_{12}$ is a CMOS buffer (a CMOS inverter). The second buffer output D$^+$, D$^-$ are the digital output V of the SDM, and they also drive the main DAC and ELD DACs. Since the 1-bit latch is one-to-one connected to the DAC unit element through the S&H circuit and buffers, by sorting, mapping, switching of the reference code of the reference DAC, a corresponding sorting, mapping, switching of the DAC unit elements is effectively achieved.

In some embodiments, the reference current may be designed to have the same common-mode current for every slice (i.e., $I_{refp,1}+I_{refn,1}=I_{refp,2}+I_{refn,2}=\ldots=I_{refp,n}+I_{refn,n}$). The differential reference current signal $I_{refp,m}-I_{refn,m}$ may be different for every slice. In some embodiments, the source-degenerated Gm stages, the connection circuit, the latches, and the samplers are exactly the same for these n slices. The $m^{th}$ ELD DAC may be an n+1-level current steering DAC.

In some embodiments, certain aspects of the techniques described above may implemented by one or more processors of a processing system executing software. The software comprises one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

A computer readable storage medium may include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., readonly memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

Note that not all of the activities or elements described above in the general description are required, that a portion of a specific activity or device may not be required, and that one or more further activities may be performed, or elements included, in addition to those described. For example, for some DAC linearization techniques, such as randomization, the information on the DAC unit element mismatch is not required. In such cases, the mismatch sensor 114, 230, 330, 430, 546 is not required. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Although a feedforward SDM architecture is shown as an example in FIGS. 1-5, the present disclosure can also be used in other SDM architectures, such as feedback architectures, and hybrid feedforward-feedback architectures. Although a single-loop SDM architecture is shown as an example in FIGS. 1-5, the present disclosure can also be used in other SDM architectures, such as Multi-stAge noise SHaping (MASH) architectures. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A sigma-delta modulator, comprising:
    a multibit quantizer configured with a mapping engine to perform one or more of a sorting operation, a mapping operation, or a switching operation, or any combination thereof within the multibit quantizer,
    wherein the mapping engine is embedded within the multibit quantizer, and
    wherein the mapping engine is external to a feedback loop of the sigma-delta modulator and is further configured to provide a linearization of the sigma-delta modulator without an output from the multibit quantizer;
    a first summing node configured to subtract a feedback analog signal from a received input analog signal and generate a first analog output signal;
    a loop filter configured to receive and filter the first analog output signal from the first summing node; and
    a second summing node configured to subtract the feedback analog signal from the first filtered analog output signal and generate a second analog output signal, wherein the multibit quantizer is further configured to receive the second analog output signal and a reference signal from the mapping engine to produce a digital output signal.

2. The sigma-delta modulator of claim 1, wherein the mapping engine is coupled between a reference signal and the multibit quantizer.

3. The sigma-delta modulator of claim 1, further comprising:
    an excess loop delay digital-to-analog converter configured to:
        receive the digital output signal via a feedback loop;
        covert the digital output signal to the feedback analog signal; and
        provide the feedback analog signal to the second summing node.

4. The sigma-delta modulator of claim 3, wherein the excess loop delay digital-to-analog converter is further configured to:
    convert the digital output signal to the feedback analog signal.

5. The sigma-delta modulator of claim 1, further comprising:
    a main digital-to-analog converter configured to:
        receive the digital output signal via a feedback loop;
        covert the digital output signal to the feedback analog signal; and
        provide the feedback analog signal to the first summing node.

6. The sigma-delta modulator of claim 5, wherein the main digital-to-analog converter is further configured to:
    provide the feedback analog signal as an input to a mismatch sensor via a direct signaling path between the main digital-to-analog converter and the mismatch sensor.

7. The sigma-delta modulator of claim 6, wherein the mismatch sensor is further configured to:
    measure a static mismatch between unit elements of the main digital-to-analog converter; and
    provide measurement information including the measured static mismatch to a logic associated with the sigma-delta modulator.

8. The sigma-delta modulator of claim 7, wherein the logic is further configured with a sorting algorithm, a mapping algorithm, or a switching algorithm, or any combination thereof.

9. The sigma-delta modulator of claim 8, wherein the mapping engine is further configured to:
    apply one or more of the sorting algorithm, the mapping algorithm, or the switching algorithm, or any combination thereof, to the reference.

10. The sigma-delta modulator of claim 6, wherein the mismatch sensor is further configured to:
    measure a dynamic mismatch between unit elements of the main digital-to-analog converter; and
    provide measurement information including the measured dynamic mismatch to a logic associated with the sigma-delta modulator.

11. The sigma-delta modulator of claim 1, wherein a feedback loop of the sigma-delta modulator comprises a set of per-bit parallel loops, each loop configured to provide a per-bit signal summation of the filtered analog output signal such that an output of the multiple per-bit parallel loops is a multi-bit quantization digital output signal.

12. A device comprising:
a first summing node configured to subtract a feedback analog signal from a received input analog signal and generate a first analog output signal;
a loop filter configured to receive and filter the first analog output signal from the first summing node;
a multilevel quantizer including a plurality of slices coupled to the loop filter to receive the filtered signal and output a digital output signal, each slice of the plurality of slices includes an amplifier coupled to a second summing node, a latch coupled to the second summing node, an excess loop delay digital-to-analog converter coupled to the second summing, and a reference digital-to-analog converter coupled to the second summing node, wherein the reference digital-to-analog converter is configured to receive from a mapping engine a set of output reference codes.

13. The device of claim 12, wherein the mapping engine is further configured to receive the digital output signal as feedback via a feedback loop plus the set of input codes to provide the set of output codes to the reference digital-to-analog converter.

14. The device of claim 12, wherein the digital output signal comprises a multibit quantization digital output signal.

15. The device of claim 12, wherein a feedback loop of the device comprises a set of per-bit parallel loops, each loop configured to provide a per-bit signal summation of the filtered analog output signal such that an output of the multiple per-bit parallel loops is a multi-bit quantization digital output signal.

16. The device of claim 12, further comprising:
a set of respective latches configured to provide an output of the multiple per-bit parallel loops to provide a multi-bit quantization digital output signal.

17. The device of claim 12, wherein the multibit quantizer is a multilevel quantizer including a number of slices of 1-bit comparator latches and a number of duplicate excess loop delay summation nodes.

18. A method comprising:
filtering, via a filter of a sigma-delta modulator, a first analog output signal;
subtracting, via a summing node of the sigma-delta modulator, a feedback analog signal from the filtered analog output signal;
generating, via an output of the summing node of the sigma-delta modulator, a second analog output signal; and
receiving, via a multibit quantizer of the sigma-delta modulator, the second analog output signal and a reference signal from a mapping engine to produce a digital output signal, wherein the mapping engine is coupled between the reference signal and the multibit quantizer, and wherein the mapping engine is external to a feedback loop of the sigma-delta modulator and is further configured to provide a linearization of the sigma-delta modulator without an output from the multibit quantizer.

19. A sigma-delta modulator, comprising:
a multibit quantizer configured with a mapping engine to perform one or more of a sorting operation, a mapping operation, or a switching operation, or any combination thereof within the multibit quantizer, wherein the mapping engine is embedded within the multibit quantizer;
a first summing node configured to subtract a feedback analog signal from a received input analog signal and generate a first analog output signal;
a loop filter configured to receive and filter the first analog output signal from the first summing node;
a second summing node configured to subtract the feedback analog signal from the first filtered analog output signal and generate a second analog output signal, wherein the multibit quantizer is further configured to receive the second analog output signal and a reference signal from the mapping engine to produce a digital output signal; and
a main digital-to-analog converter configured to:
receive the digital output signal via a feedback loop;
covert the digital output signal to the feedback analog signal;
provide the feedback analog signal to the first summing node; and
provide the feedback analog signal as an input to a mismatch sensor via a direct signaling path between the main digital-to-analog converter and the mismatch sensor.

20. The sigma-delta modulator of claim 19, further comprising:
an excess loop delay digital-to-analog converter configured to:
receive the digital output signal via a feedback loop;
covert the digital output signal to the feedback analog signal; and
provide the feedback analog signal to the second summing node.

* * * * *